(12) United States Patent
Lee et al.

(10) Patent No.: US 11,619,964 B2
(45) Date of Patent: Apr. 4, 2023

(54) METHODS FOR IMPROVING TIMING IN MEMORY DEVICES, AND RELATED DEVICES AND SYSTEMS

(71) Applicant: Micron Technology, Inc., Boise, ID (US)

(72) Inventors: Hyunui Lee, Seoul (KR); Won Joo Yun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/385,412

(22) Filed: Jul. 26, 2021

(65) Prior Publication Data

US 2023/0025173 A1 Jan. 26, 2023

(51) Int. Cl.
*G06F 1/12* (2006.01)
*G06F 1/10* (2006.01)
*G06F 1/08* (2006.01)

(52) U.S. Cl.
CPC .................. *G06F 1/10* (2013.01); *G06F 1/08* (2013.01); *G06F 1/12* (2013.01)

(58) Field of Classification Search
CPC .................. G06F 1/10; G06F 1/12; G06F 1/08
See application file for complete search history.

(56) References Cited

U.S. PATENT DOCUMENTS

| | | | |
|---|---|---|---|
| 8,819,474 B2 | 8/2014 | Schoenborn et al. | |
| 10,924,119 B1* | 2/2021 | Tak | H03L 7/1075 |
| 2003/0002608 A1* | 1/2003 | Glenn | H04L 7/0337 375/355 |
| 2003/0053574 A1* | 3/2003 | Cohen | H04L 7/0037 375/365 |
| 2006/0034394 A1* | 2/2006 | Popescu | H04L 7/033 375/360 |
| 2006/0140321 A1* | 6/2006 | Tell | H04L 7/033 375/376 |
| 2009/0252265 A1* | 10/2009 | Xia | H03L 7/0814 375/355 |
| 2010/0289544 A1* | 11/2010 | Lee | H04L 7/0331 327/159 |
| 2013/0201779 A1* | 8/2013 | Wen | G11C 29/023 365/233.13 |
| 2016/0112184 A1* | 4/2016 | Kang | H04L 25/00 375/371 |
| 2017/0365355 A1* | 12/2017 | Wang | G11C 29/12015 |

\* cited by examiner

*Primary Examiner* — Phil K Nguyen
(74) *Attorney, Agent, or Firm* — TraskBritt

(57) ABSTRACT

Methods for improving timing in memory devices are disclosed. A method may include sampling a command signal according to a clock signal to obtain standard-timing commands. The method may also include sampling the command signal according to an adjusted clock signal to obtain time-adjusted commands. The method may also include comparing the standard-timing commands and the time-adjusted commands. The method may also include determining an improved timing for the clock signal based on the comparison of the standard-timing commands and the time-adjusted commands. The method may also include adjusting the clock signal based on the improved timing. Associated systems and methods are also disclosed.

17 Claims, 9 Drawing Sheets

METHODS FOR IMPROVING TIMING IN MEMORY DEVICES, AND RELATED DEVICES AND SYSTEMS

TECHNICAL FIELD

Embodiments of the disclosure relate to timing in memory devices. More specifically, various embodiments relate to methods for improving timing for signal sampling, and to related methods, devices, and systems.

BACKGROUND

Memory devices are typically provided as internal, semiconductor, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data-rate memory (DDR), low-power double-data-rate memory (LPDDR), phase-change memory (PCM), and Flash memory.

Memory devices may be configured to, among other things, sample data signals (including, e.g., command signals) according to a clock signal. Temporal alignment between the clock signal and the data signals may be important to accurately sample (and/or provide) the data signals.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
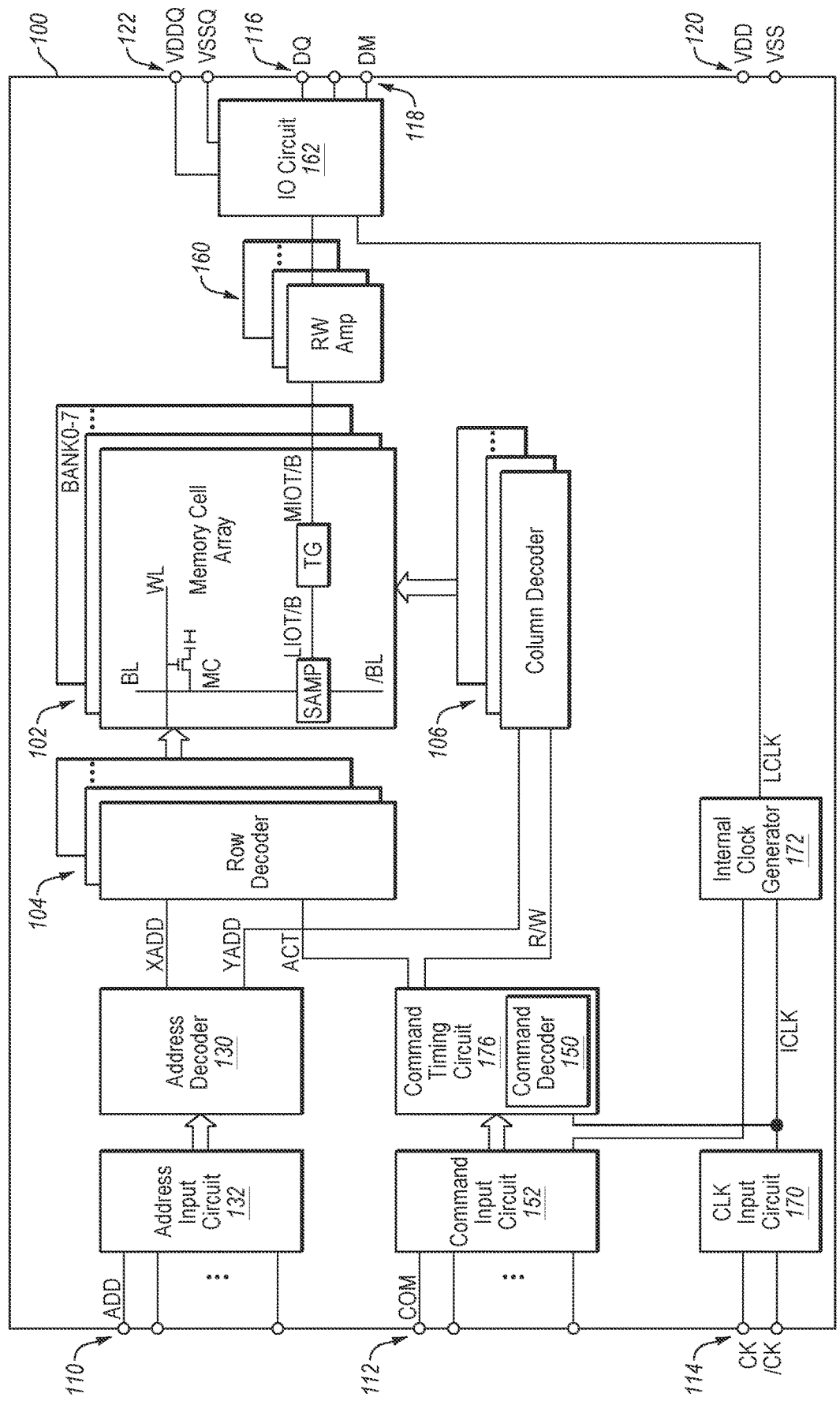
FIG. 1 is a block diagram illustrating an example memory device, in accordance with at least one embodiment of the disclosure.

A data signal (e.g., a command signal) may include transition times during which the data signal transitions between values (e.g., a logical high value and a logical low value). The transition times may occur at regular intervals. The data signal may be sampled according to a clock signal. In particular, at sampling times indicated by the clock signal, the data signal may be sampled (i.e., data samples may be taken from the data signal).

It may be important to align the clock signal with the data signal such that sampling times do not overlap with the transition times. Taking a data sample during a transition time may result in an indeterminate or incorrect data sample (i.e., a data sample that does not match a value of the data signal that was intended to be read at a given time). Thus alignment between the timing of the clock signal and the data signal (e.g., aligning a clock edge of the clock signal between transition times of the data signal) may provide for accurate sampling of the data signal.

Timing of a data signal and/or a clock signal may drift over time (e.g., the data signal and/or the clock signal may advance or delay over time). Such drift may be the result of temperature changes, voltage changes, and/or noise. Drift of the data signal and/or the clock signal may result in misalignment of the data signal and the clock signal which may result in incorrect data sampling.

Various embodiments may increase the accuracy of data sampling by, for example, determining an improved timing for a clock signal. Further, some embodiments may adjust the clock signal based on the improved timing.

For example, in some embodiments, during one or more sampling periods, a command signal may be sampled according to a clock signal to obtain standard-timing commands. An adjusted clock signal may be generated by advancing and/or delaying the clock signal by time offsets according to a search algorithm. During the one or more sampling periods, the command signal may be sampled according to the adjusted clock signal to obtain timeadjusted commands. The standard-timing commands and the time-adjusted commands may be compared to determine a pass range, e.g., to determine for which time offsets the standard-timing commands match the time-adjusted commands. Boundaries of the pass range (e.g., time offsets that are at or are one time increment beyond the pass range) may be determined. An improved timing may be determined based on pass range, e.g., a center of the pass range may be determined to be an improved timing. The clock signal may be adjusted to align with the improved timing.

Although various embodiments are described herein with reference to memory devices, the disclosure is not so limited, and the embodiments may be generally applicable to microelectronic systems and/or semiconductor devices that may or may not include memory devices. Additionally, although various embodiments are described herein with reference to command signals, the disclosure is not so limited, and the embodiments may be applicable to other timing-dependent signals, e.g., address signals, input signals, and/or output signals. Embodiments of the disclosure will now be explained with reference to the accompanying drawings.

FIG. 1 is a functional block diagram illustrating an example memory device 100, in accordance with at least one embodiment of the disclosure. Memory device 100 may include, for example, a DRAM (dynamic random-access memory), a SRAM (static random-access memory), a SDRAM (synchronous dynamic random-access memory), a DDR SDRAM (double-data-rate SDRAM, such as a DDR4 SDRAM and the like), a SGRAM (synchronous graphics random access memory) or a three-dimensional (3D) DRAM. Memory device 100, which may be integrated on a semiconductor chip, may include a memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over the complementary main data lines MIOT/B, transfer gate TG, and complementary local data lines LIOT/B, and written in the memory cell MC coupled to bit line BL or /BL.

Memory device 100 may be generally configured to be receive various inputs (e.g., from an external controller or host) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

An active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and bit line BL specified by the column address YADD may be selected.

In response to active command ACT, a read signal, a row address XADD, and a column address YADD, data may be read from the memory cell MC specified by row address XADD and column address YADD. The read data may be output via sense amplifier SAMP, transfer gate TG, read/write amplifiers 160, an input/output circuit 162, and data terminals 116. Further, in response active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by row address XADD and column address YADD.

Clock signals CK and /CK may be received via clock terminals 114. A CLK Input circuit 170 may generate internal clock signals ICLK based on the clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When the data mask signal DM is activated, overwrite of corresponding data may be prohibited.

Memory device 100 may further include command timing circuit 176. Command timing circuit 176 may be configured to improve a timing of ICLK (at least internally) to improve sampling of one or more command signals COM. For example, command decoder 150 may be configured to sample one or more command signals COM according to ICLK to identify commands (e.g., ACT and/or R/W). Command timing circuit 176 may be configured to adjust ICLK (at least internally) such that the identified commands are correct.

Figure 2:
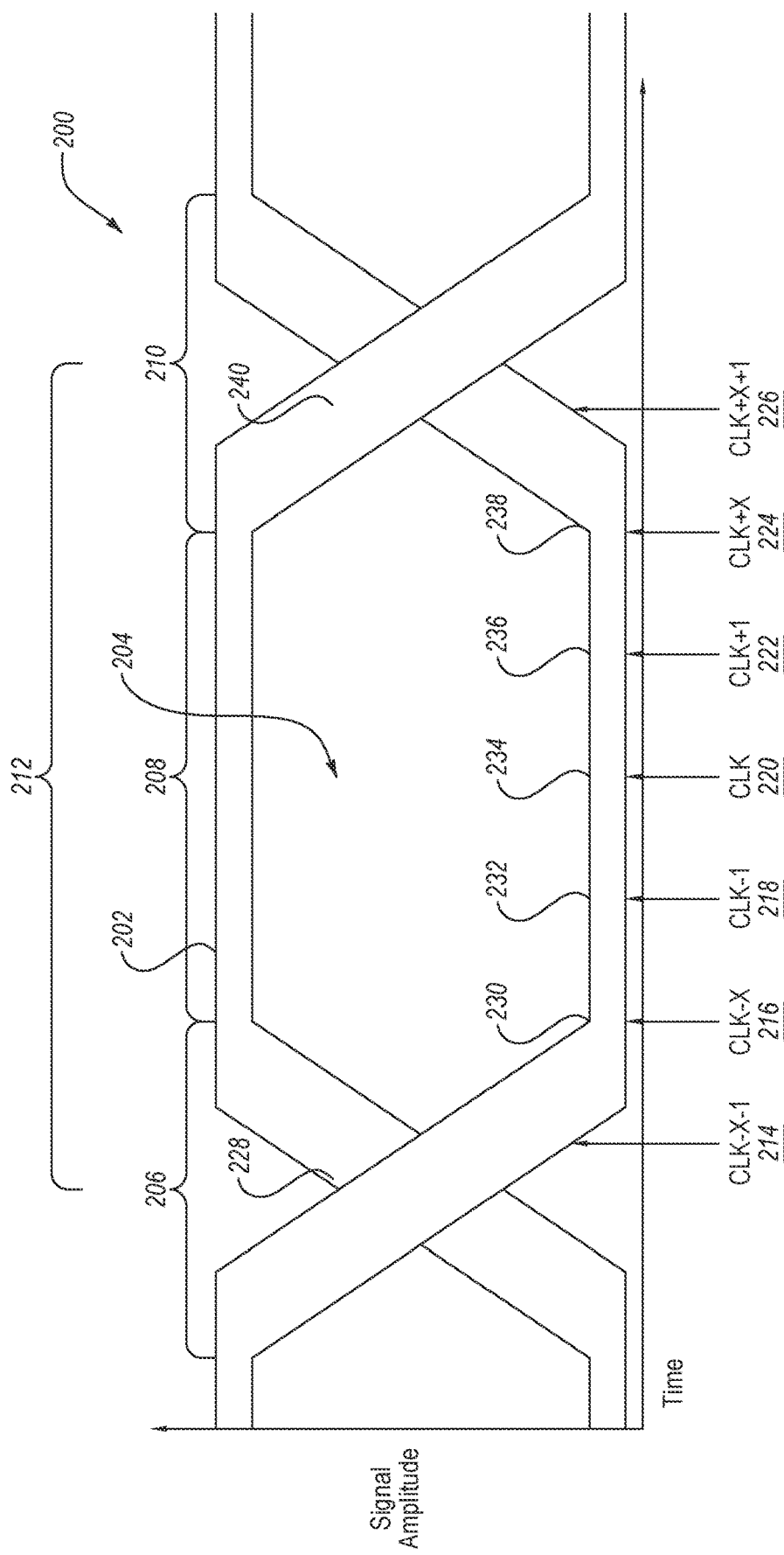
FIG. 2 is a timing diagram illustrating a relationship between example sampling times and an example command signal in accordance with at least one embodiment of the disclosure.

FIG. 2 is a timing diagram 200 illustrating a relationship between example sampling times and an example command signal 202 in accordance with at least one embodiment of the disclosure. In particular, FIG. 2 illustrates a relationship between command signal 202 and a sampling time 214, a sampling time 216, a sampling time 218, a sampling time 220, a sampling time 222, a sampling time 224, and a sampling time 226 (which may be referred to collectively as sampling times and/or individually as a sampling time).

A sampling time may be a duration of time during which charge is transferred, e.g., from a command line to an input of a command decoder, e.g., a setup-and-hold time. Sampling times may occur in response to a clock signal. In particular, sampling times may occur in response to a clock edge of the clock signal. Additionally or alternatively, one or more of the sampling times may occur a time offset before or after the clock edge of the clock signal, e.g., as illustrated in FIG. 2.

In FIG. 2, seven sampling times are illustrated as an example. Any number of sampling times may be used during a sampling period 212. The relative duration of sampling period 212 and the time increments may govern the number of sampling times per sampling period and may be a design choice. The sampling times illustrated in FIG. 2, in order of most advanced to most delayed, are: sampling time 214 (which is advanced from sampling time 220 by X+1 time increments, where X is an integer greater than one), sampling time 216 (which is advanced from sampling time 220 by X time increments), sampling time 218 (which is advanced from sampling time 220 by 1 time increment), sampling time 220, sampling time 222 (which is delayed from sampling time 220 by 1 time increment), sampling time 224 (which is delayed from sampling time 220 by X time increments), and sampling time 226 (which is delayed from sampling time 220 by X+1 time increments).

Sampling period 212 may be a duration of time during which a single command is transmitted (by inclusion in command signal 202) and/or received (by being sampled). A time increment may be a duration of time shorter than sampling period 212, for example, sampling period 212 may be divisible into multiple time increments. As an example, a time increment may be represented by the time duration illustrated between sampling time 220 and sampling time 222.

FIG. 2 illustrates command signal 202 exhibiting a shape, e.g., data eye 204. Data eye 204 includes a transition time 206, a stable time 208, and a transition time 210. Transition time 206 and transition time 210 are times during which command signal 202 may transition between values (e.g., a logical high value and a logical low value). Stable time 208 is a time during which command signal 202 is stable, e.g., between transition times.

During stable time 208 may be an ideal time to sample command signal 202. For example, sampling command signal 202 at sampling time 216 may result in a sample 230, sampling command signal 202 at sampling time 218 may result in a sample 232, sampling command signal 202 at sampling time 220 may result in a sample 234, sampling command signal 202 at sampling time 222 may result in a sample 236, and sampling command signal 202 at sampling time 224 may result in a sample 238. All of sample 230, sample 232, sample 234, sample 236, and sample 238 may match, i.e., may have the same logical value.

Sampling command signal 202 during transition time 206 and/or transition time 210 may result in indeterminate or incorrect sampled values. For example, sampling command signal 202 at sampling time 214 may result in a sample 228 and sampling command signal 202 at sampling time 226 may result in a sample 240. Sample 228 and/or sample 240 may be indeterminate. Or, sample 228 and/or sample 240 may not match sample 234, sample 232, sample 236, sample 230, and sample 238. In other words, sample 228 and sample 240 may be indeterminate and/or have a different logical value than any of sample 234, sample 232, sample 236, sample 230, and sample 238.

In some instances, the timing of the clock signals and/or the data signals may drift, e.g., as a result of temperature changes, voltage changes, and/or noise. Such a drift may result in a misalignment between the clock signal and the command signal which may result in incorrect sampling of the command signal.

For example, a command decoder (e.g., command decoder 150 of FIG. 1) may be configured to sample a command signal (e.g., COM of FIG. 1) according to a clock edge of a clock signal (e.g., ICLK of FIG. 1). Initially, the command decoder may sample the command signal at a time corresponding to sampling time 220 according to the clock edges of the clock signal. One of the command signal or the clock signal may drift relative to the other. For example, if the clock signal advances (or the command signal delays), the clock edge of the clock signal that gave rise to sampling time 220 may advance, i.e., shift to the left of FIG. 2. If this drift continues, the clock edge may occur during transition time 206, which may result in incorrect sampling of the command signal.

Various embodiments may be configured to improve sampling of command signals by determining an improved timing and/or adjusting a clock signal according to the improved timing. Adjusting a clock signal according to an improved timing may cause sampling to occur during a stable time and/or prevent sampling during a transition time which may improve the accuracy of sampling the command signal.

Figure 3:
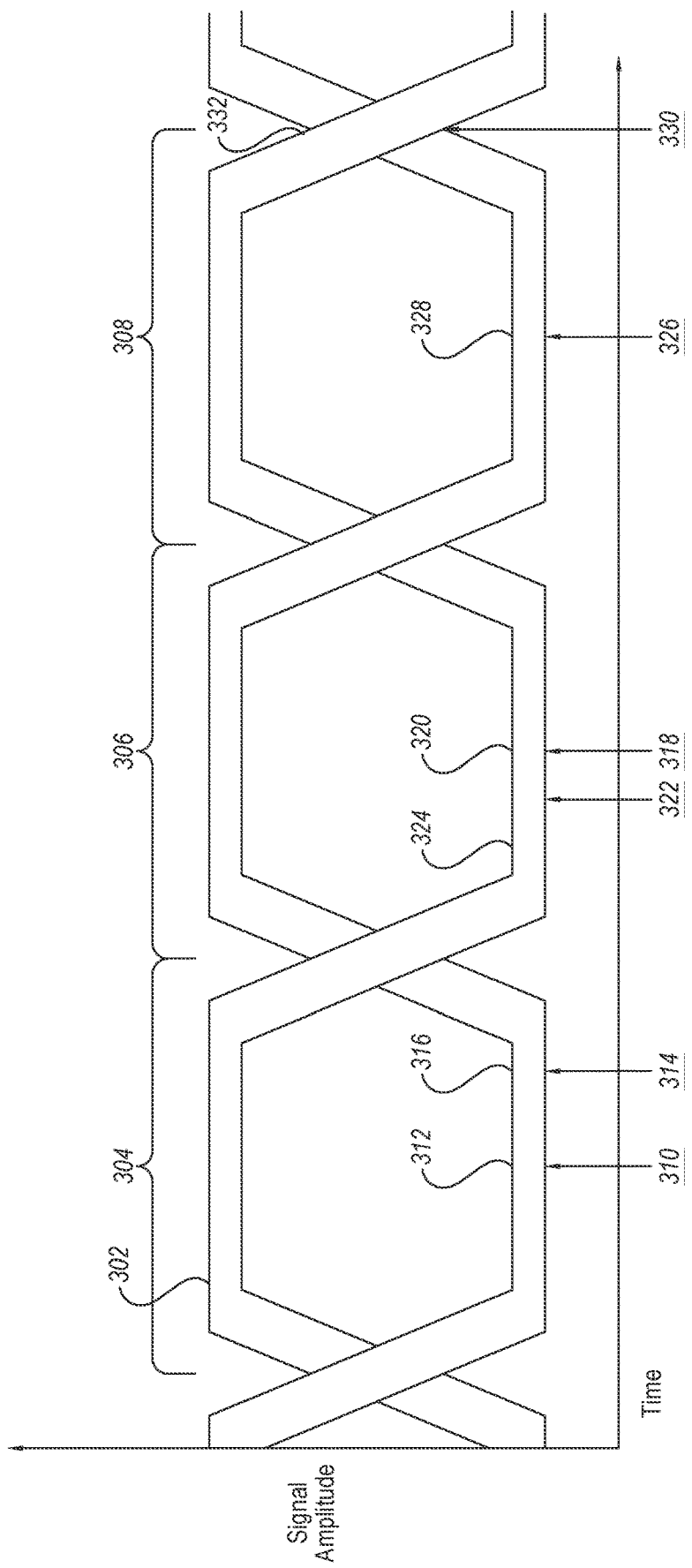
FIG. 3 is a timing diagram illustrating a relationship between example sampling times and an example command signal in accordance with at least one embodiment of the disclosure.

For example, various embodiments may be configured to sample a data signal during each of one or more sampling periods according to a clock edge of a clock signal (e.g., at sampling time 220), resulting in a standard-timing command (e.g., sample 234) for each sampling period. Additionally, the various embodiments may be configured to sample the data signal during each of the one or more sampling periods at a time advanced or delayed from the clock edge of the clock signal by a time offset (e.g., at one of sampling time 214, sampling time 216, sampling time 218, sampling time 222, sampling time 224, or sampling time 226), resulting in a time-adjusted command for each sampling period (e.g., one of sample 228, sample 230, sample 232, sample 236, sample 238, or sample 240). The time offset may be different at each of the one or more sampling periods. During or following each of the one or more sampling periods, a standard-timing command of the standard-timing commands may be compared to a corresponding time-adjusted command of the time-adjusted commands. Based on the comparisons of the standard-timing commands and the time-adjusted commands, an improved timing may be determined. In some embodiments, the clock signal may be adjusted according to the improved timing such that thereafter, data samples according to the adjusted clock signal align with the data signal. FIG. 3 provides an example of sampling a command signal 302 according to a clock signal and an adjusted clock signal in three consecutive sampling periods.

FIG. 3 is a timing diagram 300 illustrating a relationship between example sampling times and an example command signal 302 in accordance with at least one embodiment of the present disclosure. In particular, during sampling period 304, command signal 302 may be sampled at a sampling time 310 to produce a sample 312 and at a sampling time 314 to produce a sample 316. During sampling period 306, command signal 302 may be sampled at a sampling time 318 to produce a sample 320 and at a sampling time 322 to produce a sample 324. During sampling period 308 command signal 302 may be sampled at a sampling time 326 to produce a sample 328 and at a sampling time 330 to produce a sample 332.

Each of sampling time 310, sampling time 318, and sampling time 326 may be according to a clock signal without adjustment. For example, each of sampling time 310, sampling time 318, and sampling time 326 may relate to sampling period 304, sampling period 306, and sampling period 308 respectively in the same way that sampling time 220 of FIG. 2 relates to sampling period 212 of FIG. 2. Additionally or alternatively, each of sampling time 310, sampling time 318, and sampling time 326 may be according to clock edges without any advance or delay. As such, each of sample 312, sample 320, and sample 328 may be an instance of a standard-timing command.

Each of sampling time 314, sampling time 322, and sampling time 330 may be adjusted relative to the clock signal. For example, sampling time 314 may be delayed, e.g., by X time increments relative to the clock signal. As such, sampling time 314 may relate to sampling period 304 in the same way that sampling time 224 of FIG. 2 relates to sampling period 212 of FIG. 2. Sampling time 322 may be advanced, e.g., by 1 time increment relative to the clock signal. As such, sampling time 322 may relate to sampling period 306 in the same way that sampling time 218 of FIG. 2 relates to sampling period 212 of FIG. 2. Sampling time 330 may be delayed, e.g., by X+1 time increments relative to the clock signal. As such, sampling time 330 may relate to sampling period 308 in the same way that sampling time 226 of FIG. 2 relates to sampling period 212 of FIG. 2. Thus, each of sample 316, sample 324, and sample 332 may be an instance of a time-adjusted command.

During or following sampling period 304, sample 316 may be compared with sample 312, during or following sampling period 306, sample 324 may be compared with sample 320, and during or following sampling period 308, sample 332 may be compared with sample 328.

Because sample 316 matches the sample 312, sampling time 314 may be determined to be included in the pass range. Also, because sample 324 matches sample 320, sampling time 322 may be determined to be included in the pass range. Because sample 332 does not match sample 328, sampling time 330 may be determined to be outside the pass range. Through additional sampling during additional sampling periods (not illustrated) the pass range may be determined, additionally or alternatively, boundaries of the pass range may be determined.

For example, returning to the examples sampling times and samples of FIG. 2, a pass range may be determined to include X time increments advanced from sampling time 220 and X time increments delayed after sampling time 220 (in other words, the pass range may be determined to be −X to X). Additionally or alternatively, boundaries of the pass range may be determined, e.g., based on sample 228 and/or sample 240 not matching respective instances of sample 234 (and based on sample 230 and sample 238 matching respective instances of sample 234), it may be determined that the pass range is −X to X and/or that −(X+1) and (X+1) are beyond the pass range. Additionally or alternatively, a center of the pass range may be determined. Further, in some embodiments, it may be determined that a center of the pass range is an improved timing. In some embodiments, the clock signal may be adjusted to align with the improved timing.

For example, if the clock signal has drifted relative to the data clock signal such that data were being sampled at sampling time 218 according to the drifted clock signal (such that sample 232 is the standard-timing command), the sampling at sampling time 214, sampling time 216, sampling time 224, and sampling time 226, may reveal that sampling time 220 is the improved timing and the clock signal may be adjusted such that the clock edge aligns with sampling time 220.

In some embodiments, the selection of time offsets for each sampling period may be based on results of one or more prior comparisons. For example, if sample 228 (sampled at a time offset advanced by X+1 increments) does not match sample 234, a time offset advanced by of X+2 increments may or may not be selected as a time offset. As another example, based on sample 230 (sampled at a time offset advanced by X increments) matching sample 234 a time offset advanced by fewer than X increments (e.g., sampling time 218) may or may not be selected as a time offset.

The order and/or inclusion of the sampling at each of sampling time 214, sampling time 216, sampling time 218, sampling time 222, sampling time 224, and sampling time 226 may be according to a search algorithm, e.g., on one of: a linear search algorithm, a binary search algorithm, and a random search algorithm. For example, according to a linear search algorithm, at each subsequent sampling period, the time offset may be increased or decreased by one time increment until boundaries of the pass range are determined. As another example, according to a random search algorithm, at each subsequent sampling period, a random time offset may be selected until the pass range is identified.

Command signal 202 may be continuous, e.g., command signal 202 may include a data eye 204 including new data at regular intervals, e.g., every clock cycles of a circuit. Some embodiments may be configured to, at each sampling period (e.g., according to the regular intervals of the command signal 202), sample the command signal according to each of the clock signal and the adjusted clock signal to obtain a standard-timing command and a time-adjusted command. At each sampling period, the standard-timing command and the time-adjusted command may be compared. Further, in some embodiments, an improved timing may be analyzed at regular intervals, e.g., every sampling period, every other sampling periods, or every third sampling period. For example, at each sampling period it may be determined whether previously-performed comparisons provide information sufficient to determine an improved timing. For example, it may be determined whether the previously-performed comparisons provide information sufficient to determine a pass range or a center of a pass range.

In some embodiments, determining an improved timing may include determining that a timing different than the timing that gave rise to the standard-timing command would sample more close to a center of stable time 208 than the timing that gave rise to the standard-timing command. Additionally or alternatively, determining an improved timing may include determining that a timing that gave rise to the standard-timing command is within stable time 208 and/or that no adjustment is necessary.

Figure 4:
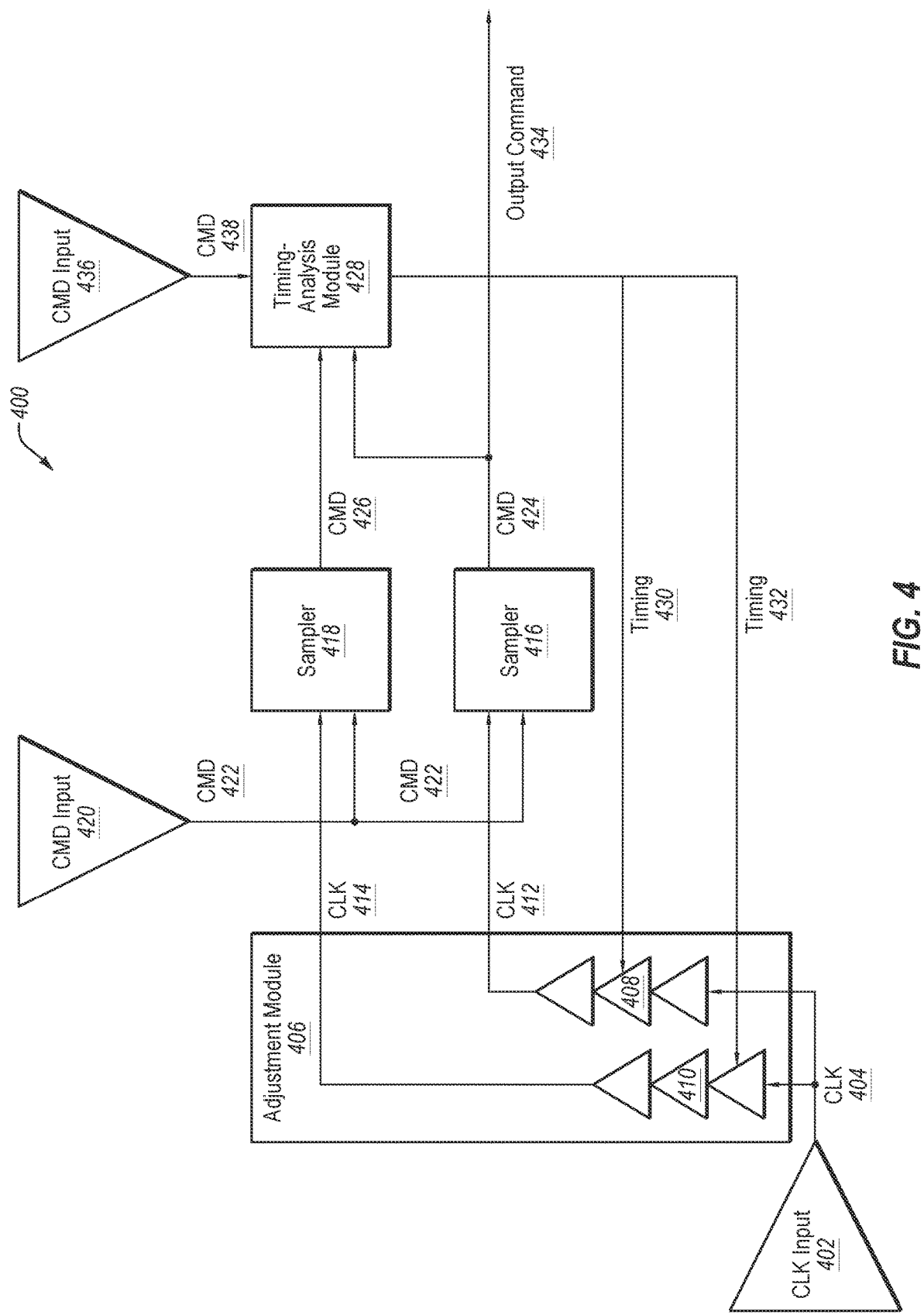
FIG. 4 is a functional block diagram illustrating an example timing circuit in accordance with at least one embodiment of the disclosure.

FIG. 4 is a functional block diagram illustrating an example timing circuit 400 in accordance with at least one embodiment of the disclosure. Timing circuit 400 may be configured to obtain a standard-timing command and to determine an improved timing. Timing circuit 400 may include a clk input 402, an adjustment module 406 (including an adjustment element 408, and an adjustment element 410), a sampler 416, a sampler 418, a command (CMD) input 420, a timing-analysis module 428, and a CMD input 436.

An incoming clock signal (e.g., incoming clock signal 404) may be received via clk input 402. For example, ICLK or LCLK of FIG. 1 may be received at clk input 402.

Incoming clock signal 404 may be delayed and/or advanced at adjustment module 406 to produce a clock signal 412, and an adjusted clock signal 414. In particular, incoming clock signal 404 may be delayed (or advanced) at adjustment element 408 to produce clock signal 412 and incoming clock signal 404 may be delayed (or advanced) at adjustment element 410 to produce adjusted clock signal 414.

Each of adjustment element 408 and adjustment element 410 may be any suitable delay element, e.g., one or more inverters buffers, and/or RC delay components. Additionally or alternatively, one or more of adjustment element 408 and adjustment element 410 may be configured to advance a clock signal.

Command signal 422 may be received at CMD input 420. Command signal 422 may be, for example, a command signal (e.g., COM of FIG. 1).

Sampler 416 may be configured to sample command signal 422 according to clock signal 412 to produce standard-timing command 424. Sampler 418 may be configured to sample command signal 422 according to adjusted clock signal 414 to produce time-adjusted command 426. Each of sampler 416 and sampler 418 may include a latch circuit and/or a decoder, e.g., a command decoder 150 of FIG. 1. Timing circuit 400 may be configured to output standard-timing command 424 as an output command 434.

Timing-analysis module 428 may be configured to receive standard-timing command 424 from sampler 416, and time-adjusted command 426 from sampler 418. Timing-analysis module 428 may be configured to compare standard-timing command 424 to time-adjusted command 426. Based on the comparison between multiple instances of standard-timing command 424 to multiple instances of time-adjusted command 426, timing-analysis module 428 may be configured to determine an improved timing.

For example, timing-analysis module 428 may be configured to receive a standard-timing command 424 at each of multiple sampling periods and to receive a time-adjusted command 426 at each of the multiple sampling periods. At each of the multiple sampling periods, timing-analysis module 428 may compare a received standard-timing command 424 to a received time-adjusted command 426. Based on one or more of the comparisons at the multiple sampling periods, timing-analysis module 428 may be configured to determine an improved timing. For example, based on the one or more comparisons, a pass range may be determined and/or a center of the pass range may be determined.

Timing-analysis module 428 may be configured to determine time offsets 432 used to produce time-adjusted command 426. For example, timing-analysis module 428 may be configured to determine time offsets 432 and provide time offsets 432 to adjustment module 406. Adjustment module 406 may be configured to delay (or advance) incoming clock signal 404 according to time offsets 432 to produce adjusted clock signal 414. For example, adjustment element 410 may include multiple delay paths or tap points that may be selected based on time offsets 432 to produce adjusted clock signal 414 according to time offsets 432. Sampler 418 may be configured to sample command signal 422 according to adjusted clock signal 414 to produce time-adjusted command 426. Thus, feedback from timing-analysis module 428 may control sampling of command signal 422 to obtain time-adjusted command 426.

Timing-analysis module 428 may be configured to determine a time offset of time offsets 432 each sampling period. For example, each sampling period, timing-analysis module 428 may determine a different time offset. Further, timing-analysis module 428 may be configured to store information regarding which time offsets have been used and/or results of comparisons between a standard-timing command and a time-adjusted command for the used time offsets.

Timing-analysis module 428 may be configured to determine time offsets 432 according to a search algorithm, e.g., on one of: a linear search algorithm, a binary search algorithm, and a random search algorithm. In some embodiments, a time offset of time offsets 432 may be determined based on a prior comparison.

Timing-analysis module 428 may be configured to determine an improved timing 430, which may be or may include a time offset for standard-timing command 424 (which may be output as output command 434). For example, timing-analysis module 428 may be configured to determine improved timing 430 and to provide improved timing 430 to adjustment module 406. Adjustment module 406 may be configured to delay (or advance) incoming clock signal 404 according to improved timing 430 to produce clock signal 412. For example, adjustment element 408 may include multiple delay paths or tap points that may be selected based on improved timing 430 to produce clock signal 412 according to improved timing 430. Sampler 416 may be configured to sample command signal 422 according to clock signal 412 to produce standard-timing command 424 which may be output as output command 434. Thus, timing-analysis module 428 may control and/or adjust timing of sampling of command signal 422 to obtain output command 434.

Additionally, in some embodiments, timing-analysis module 428 may be configured to receive an alternate command signal 438, e.g., from CMD input 436. Alternate command signal 438 may be a signal selected to verify standard-timing command 424 and/or time-adjusted command 426. For example, in some cases, a comparison between standard-timing command 424 and time-adjusted command 426 may result in a mismatch. For example, standard-timing command 424 may indicate a write command and time-adjusted command 426 may indicate a read command. In some cases, where standard-timing command 424 and time-adjusted command 426 do not match, it may be unclear which of standard-timing command 424 or time-adjusted command 426 is correct. Alternate command signal 438 may be provided to timing-analysis module 428 so that timing-analysis module 428 may be able to determine which of standard-timing command 424 or time-adjusted command 426 is correct. As an example, a write-data-strobe signal, a read-data-strobe signal, a parity signal, and/or a data mask signal may be selected as alternate command signal 438.

Additionally, in some embodiments, timing-analysis module 428 may be configured to perform pattern analysis and/or learning based on patterns. For example timing-analysis module 428 may be configured to identify an improved timing related to a pattern of commands. For example timing-analysis module 428 may be configured to identify a pattern of commands (e.g., three or more read commands in a row, a write command followed by a read command a read command followed by a write command, and act command followed by a read command, or an act command followed by a write command) and to identify an improved timing related to the pattern of commands. For example, timing-analysis module 428 may identify that after three or more read commands in a row, a delay of one time increment improves subsequent sampling, e.g., by moving the timing of standard-timing command one time increment later.

Figure 5:
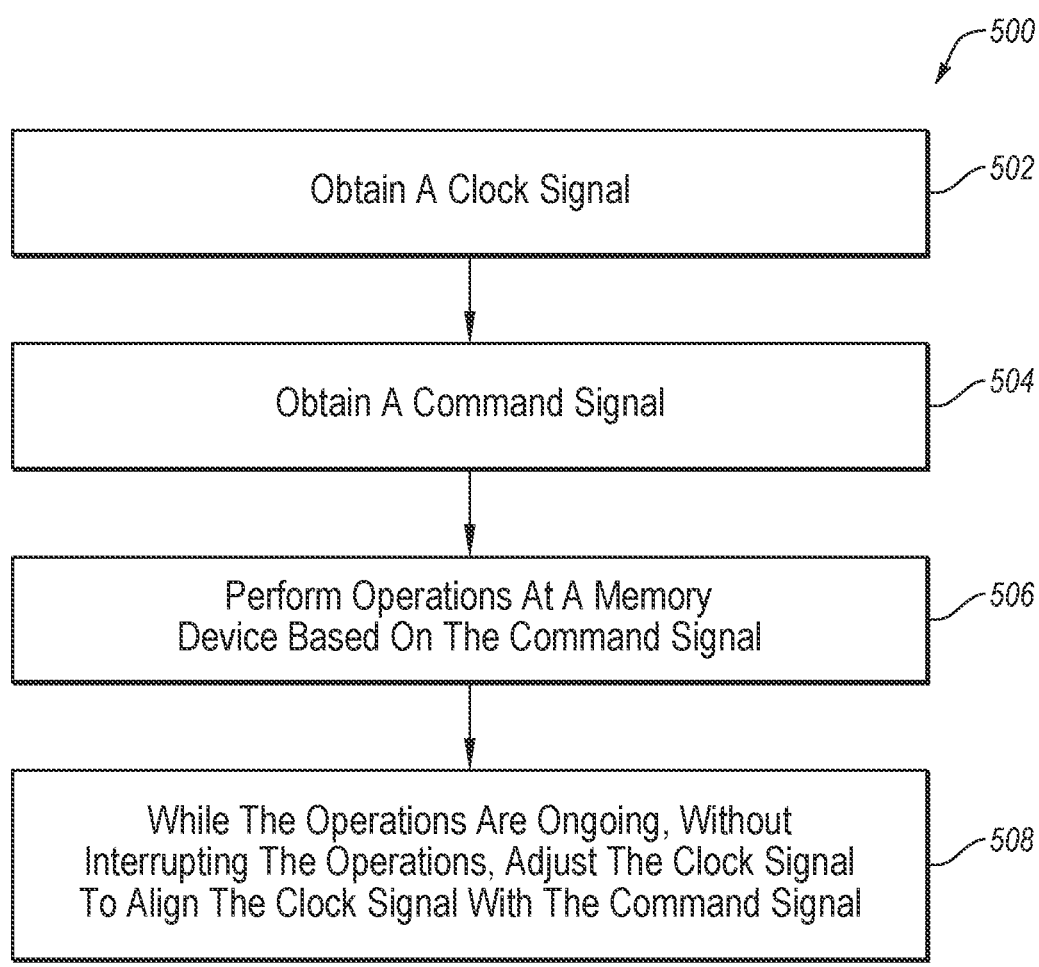
FIG. 5 illustrates a method for reducing timing errors in a memory device in accordance with at least one embodiment of the disclosure.

FIG. 5 is a flowchart illustrating an example method 500 in accordance with at least one embodiment of the disclosure. Method 500 may be arranged in accordance with at least one embodiment described in the disclosure. Method 500 may be performed, in some embodiments, by a device or system, such as memory device 100 of FIG. 1, memory system 800 of FIG. 8, electronic system 900 of FIG. 9, or another device or system. Some steps of method 500 may be performed by timing circuit 400 of FIG. 4. Although illustrated as discrete blocks, various blocks may be divided into additional blocks, combined into fewer blocks, or eliminated, depending on the desired implementation.

At block 502, a clock signal may be obtained. Clock signal ICLK and/or clock signal LCLK of FIG. 1, and incoming clock signal 404 of FIG. 4, are examples of the clock signal of block 502.

At block 504, a command signal may be obtained. Command signal COM of FIG. 1 and command signal 422 of FIG. 4 are examples of the command signal received at block 504.

At block 506, operations may be performed at a memory device based on the command signal. For example, the command signal may be indicative of a read or write command and the operation may include reading or writing data. The reading or writing data may occur at a memory device, e.g., memory device 100 of FIG. 1.

At block 508, while the operations are ongoing, and without interrupting the operations, the clock signal may be adjusted to align the clock signal with the command signal. An example of adjusting the clock signal to align the clock signal with the command signal is described with regard to timing circuit 400 of FIG. 4 with regard to the timing diagram 200 of FIG. 2.

Modifications, additions, or omissions may be made to method 500 without departing from the scope of the disclosure. For example, the operations of method 500 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 6:
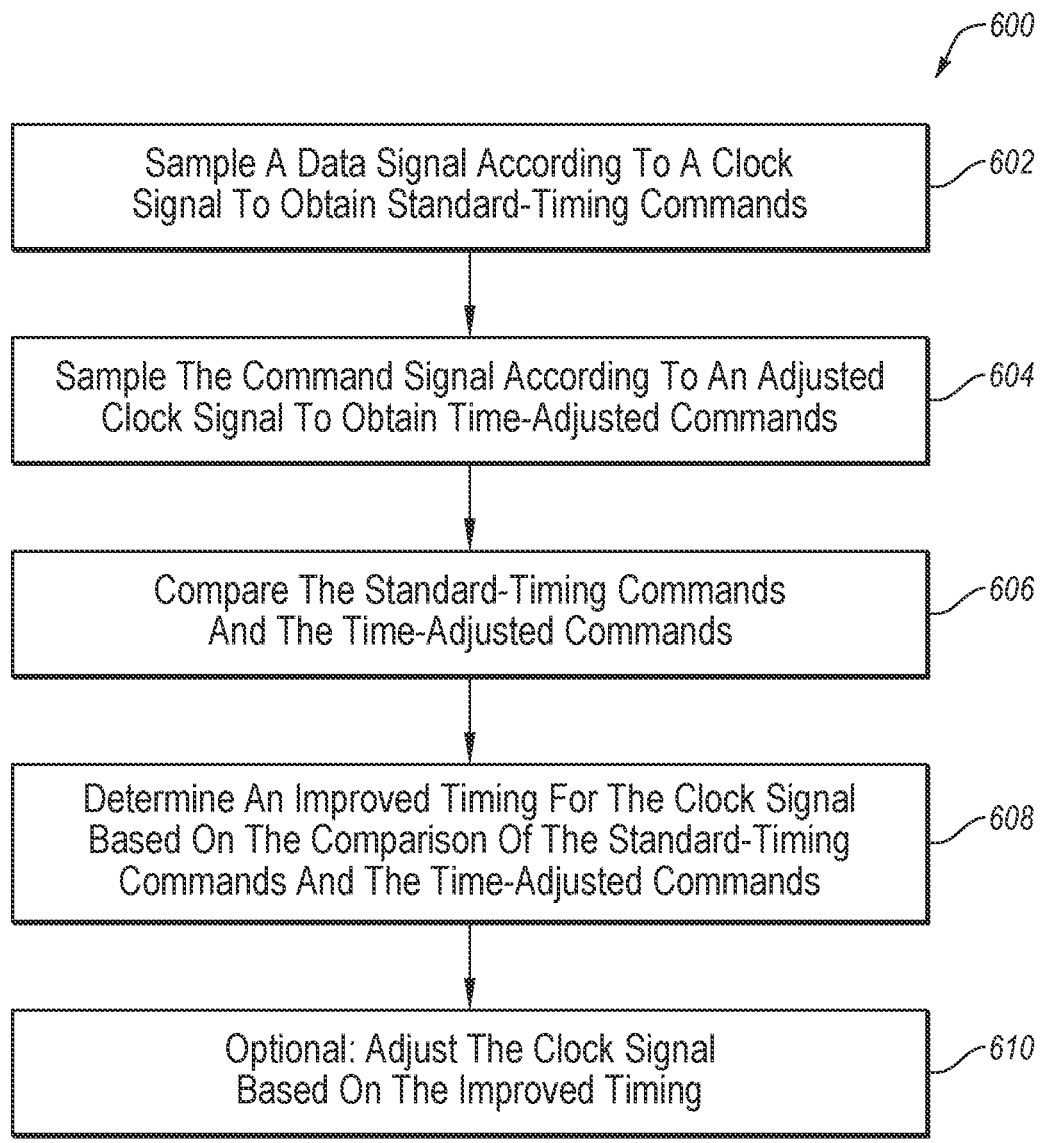
FIG. 6 illustrates a method in accordance with at least one embodiment of the disclosure.

FIG. 6 is a flowchart illustrating an example method 600 in accordance with at least one embodiment of the disclosure. Method 600 may be arranged in accordance with at least one embodiment described in the disclosure. Method 600 may be performed, in some embodiments, by a device or system, such as memory device 100 of FIG. 1, timing circuit 400 of FIG. 4, memory system 800 of FIG. 8, electronic system 900 of FIG. 9, or another device or system. Although illustrated as discrete blocks, various blocks may be divided into additional blocks, combined into fewer blocks, or eliminated, depending on the desired implementation.

At block 602, a command signal may be sampled according to a clock signal to obtain standard-timing commands. Command signal COM of FIG. 1 and command signal 422 of FIG. 4 are examples of the command signal sampled at block 602. Clock signal ICLK and/or clock signal LCLK of FIG. 1, and clock signal 412 of FIG. 4, are examples of the clock signal of block 602. Sample 234 of FIG. 2 may be an example of one of the standard-timing commands of block 602.

At block 604, the command signal may be sampled according to an adjusted clock signal to obtain time-adjusted commands. Adjusted clock signal 414 of FIG. 4, is an example of the adjusted clock signal of block 604. Any of sample 228, sample 230, sample 232, sample 236, sample 238, or sample 240 may be an example of one of the time-adjusted commands of block 604.

At block 606, the standard-timing commands and the time-adjusted commands may be compared. In particular, each standard-timing command of a number of standard-timing commands may be compared to a respective time-adjusted command of a corresponding number of time-adjusted commands.

At block 608, an improved timing for the clock signal may be determined based on the comparison of the standard-timing commands and the time-adjusted commands. The improved timing may be or may include a timing that causes subsequent standard-timing commands to be sampled closer to a center of a stable time (e.g., stable time 208 of FIG. 2). The improved timing may be or may include a number of increments of time delay to apply to a clock signal.

At block 610, which is optional, the clock signal may be adjusted based on the improved timing.

Modifications, additions, or omissions may be made to method 600 without departing from the scope of the disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

Figure 7:
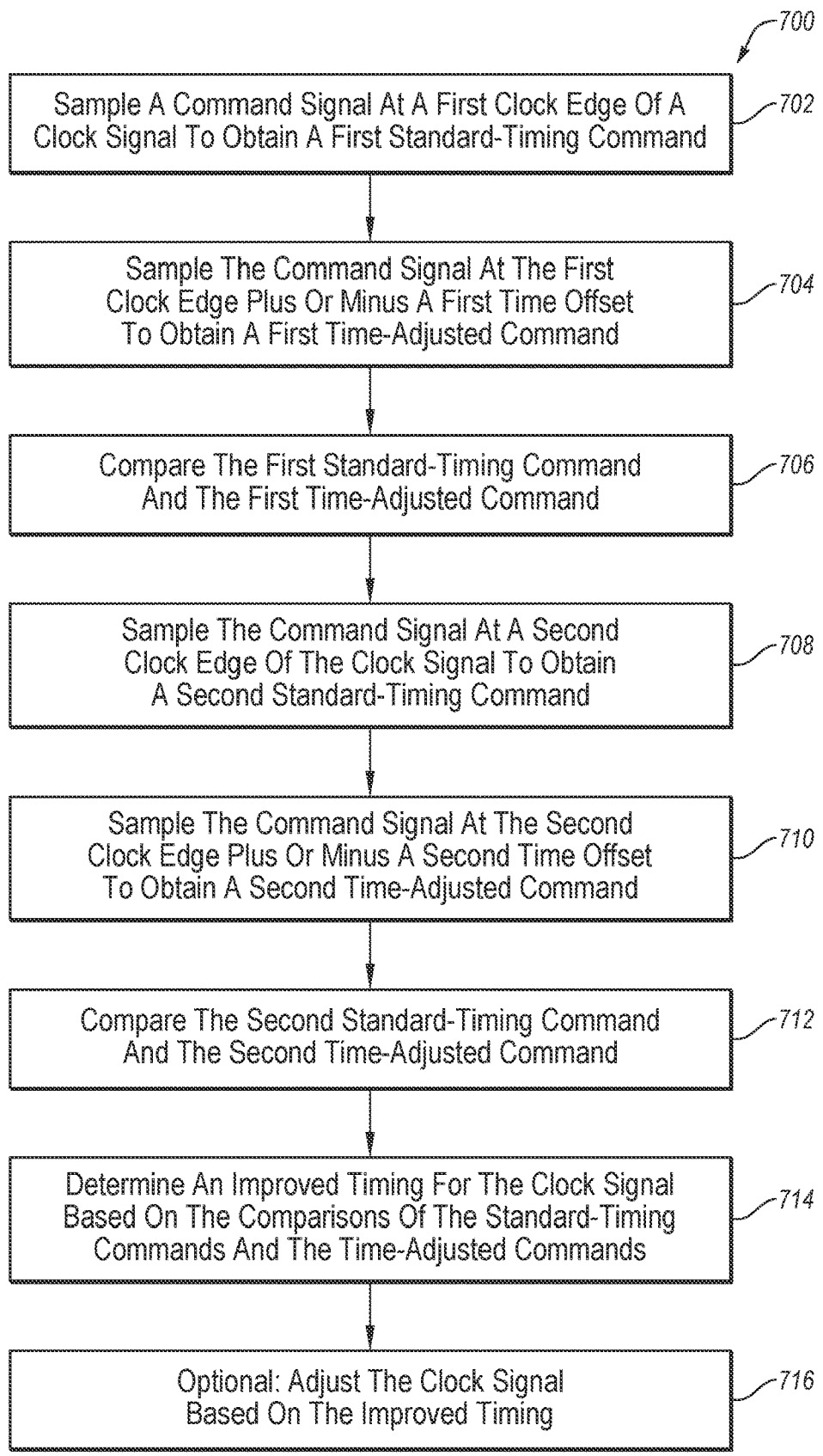
FIG. 7 illustrates a method in accordance with at least one embodiment of the disclosure.

FIG. 7 is a flowchart illustrating an example method 700 in accordance with at least one embodiment of the disclosure. Method 700 may be arranged in accordance with at least one embodiment described in the disclosure. Method 700 may be performed, in some embodiments, by a device or system, such as memory device 100 of FIG. 1, timing circuit 400 of FIG. 4, memory system 800 of FIG. 8, electronic system 900 of FIG. 9, or another device or system. Although illustrated as discrete blocks, various blocks may be divided into additional blocks, combined into fewer blocks, or eliminated, depending on the desired implementation.

At block 702, a command signal may be sampled at a first clock edge of a clock signal to obtain a first standard-timing command. Command signal COM of FIG. 1 and command signal 422 of FIG. 4 are examples of the command signal sampled at block 702. Clock signal ICLK and/or clock signal LCLK of FIG. 1, and clock signal 412 of FIG. 4, are examples of the clock signal of block 702. Sample 234 of FIG. 2 may be an example of the first standard-timing command of block 702.

At block 704, the command signal may be sampled at the first clock edge plus or minus a first time offset to obtain a first time-adjusted command. Adjusted clock signal 414 of FIG. 4, is an examples of the adjusted clock signal of block 704. Any of sample 228, sample 230, sample 232, sample 236, sample 238, or sample 240 may be an example of the first time-adjusted command of block 704.

At block 706, the first standard-timing command and the first time-adjusted command may be compared. For example, the first standard-timing command may be compared to the first time-adjusted command.

At block 708, the command signal may be sampled at a second clock edge of the clock signal to obtain a second standard-timing command. Sample 234 of FIG. 2 may be an example of the second standard-timing command of block 708.

At block 710, the command signal may be sampled at the second clock edge plus or minus a second time offset to obtain a second time-adjusted command. A different one of sample 228, sample 230, sample 232, sample 236, sample 238, or sample 240 may be an example of the second time-adjusted command of block 708. In some embodiments, the second time offset may be selected based on one or both of the first time offset or the comparison of block 706.

At block 712, the second standard-timing command and the second time-adjusted command may be compared. For example, the second standard-timing command may be compared to the second time-adjusted command.

At block 714, an improved timing for the clock signal may be determined based on the comparisons of the standard-timing commands and the time-adjusted commands i.e., based on the comparisons of block 706, and block 712.

At block 716, which is optional, the clock signal may be adjusted based on the improved timing.

Modifications, additions, or omissions may be made to method 700 without departing from the scope of the disclosure. For example, the operations of method 700 may be implemented in differing order. For example, according to the first time offset, block 704 may precede or follow block 702. Likewise, according to the second time offset, block 710 may precede or follow block 708. Furthermore, the outlined operations and actions are only provided as examples, and some of the operations and actions may be optional, combined into fewer operations and actions, or expanded into additional operations and actions without detracting from the essence of the disclosed embodiment.

Figure 8:
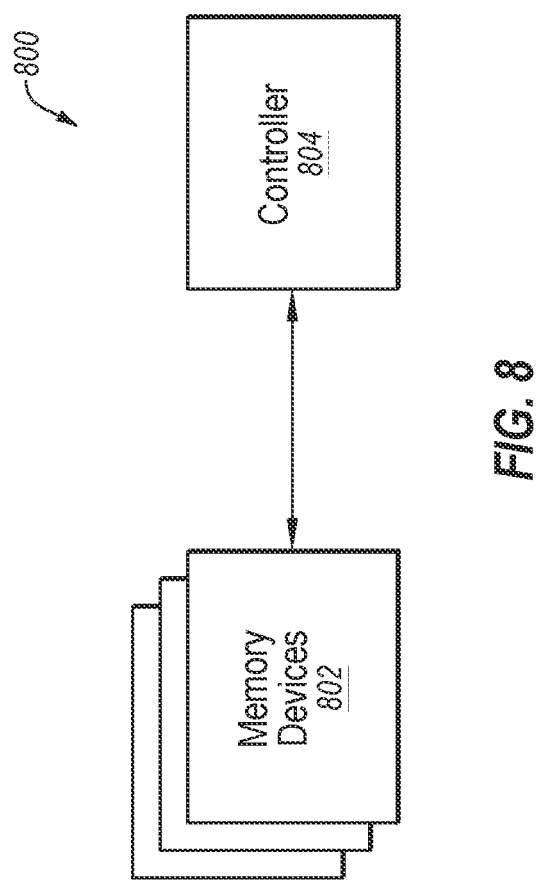
FIG. 8 is a simplified block diagram illustrating an example memory system, in accordance with at least one embodiment of the disclosure.

FIG. 8 is a simplified block diagram illustrating an example memory system 800 implemented in accordance with at least one embodiment of the disclosure. Memory system 800, which may include, for example, a semiconductor device, includes a number of memory devices 802 and a controller 804. Controller 804 may be operatively coupled with memory devices 802 so as to convey command/address signals (e.g., command/address signals received by command terminals 112 and/or address terminals 110 of FIG. 1) to memory devices 802.

At least one of memory devices 802 (e.g., memory device 100 of FIG. 1) and/or controller 804 of memory system 800 may include one or more timing circuit 400 of FIG. 4, according to one or more embodiments disclosed herein. Additionally or alternatively, memory system 800 may be configured to implement one or more of the method 500 of FIG. 5, method 600 of FIG. 6, or method 700 of FIG. 7.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 9:
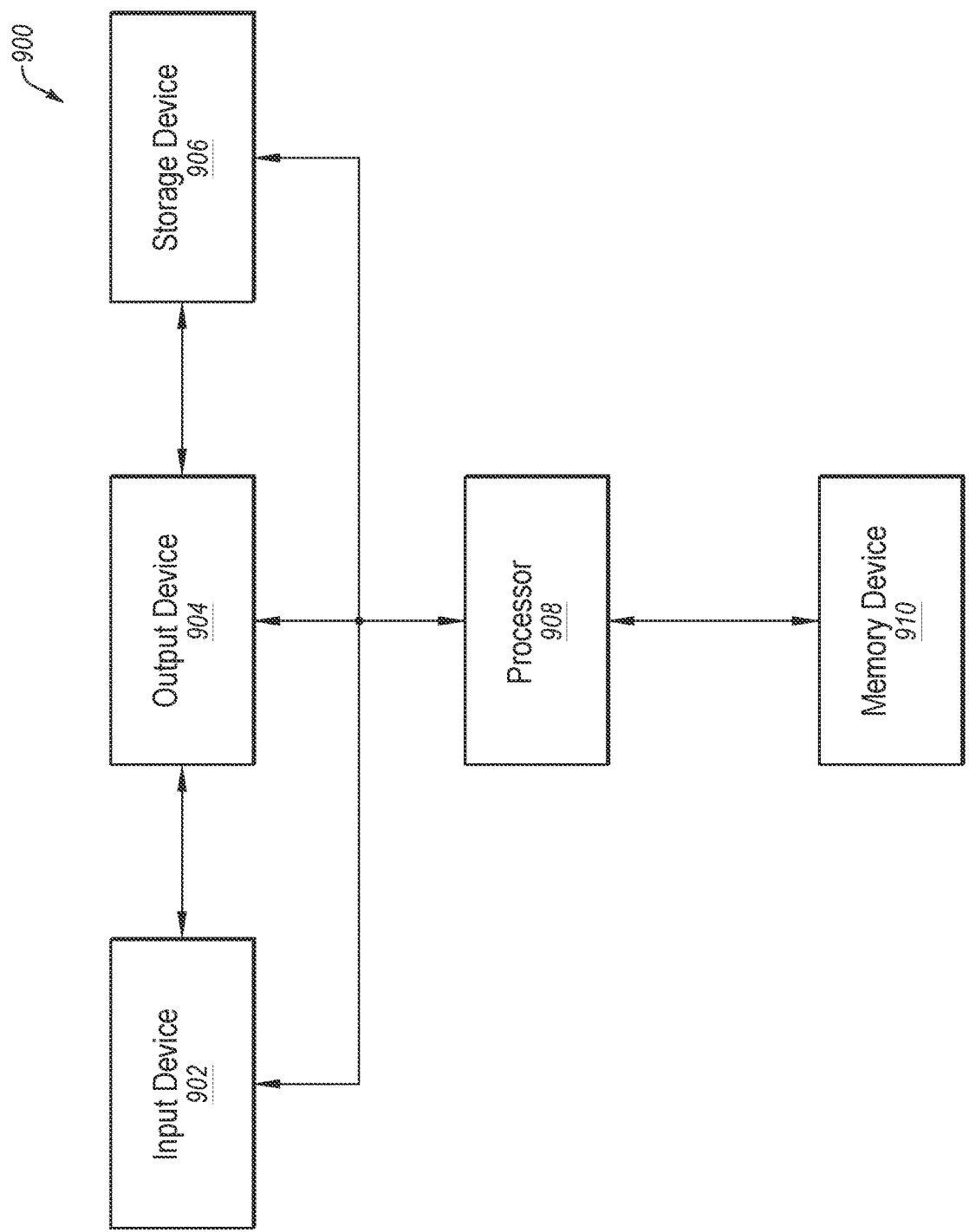
FIG. 9 is a simplified block diagram illustrating an example electronic system, in accordance with at least one embodiment of the disclosure.

FIG. 9 is a simplified block diagram illustrating an electronic system 900 implemented in accordance with at least one embodiment of the disclosure. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory device 910 coupled to processor 908. Memory device 910 may include at least a portion of memory system 800 of FIG. 8. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments may include a method. The method may include sampling a command signal according to a clock signal to obtain standard-timing commands. The method may also include sampling the command signal according to an adjusted clock signal to obtain time-adjusted commands. The method may also include comparing the standard-timing commands and the time-adjusted command. The method may also include determining an improved timing for the clock signal based on the comparison of the standard-timing commands and the time-adjusted commands.

Various embodiments may include a method for reducing timing errors in a memory device. The method may include obtaining a clock signal and obtaining a command signal. The method may also include performing operations at the memory device based on the command signal. The method may also include, while the operations are ongoing, without interrupting the operations, adjusting the clock signal to align the clock signal with the command signal.

Various embodiments may include a memory device. The memory device may include a first sampler configured to sample a command signal according to a clock signal to generate standard-timing commands. The memory device may also include an adjustment element configured to advance or delay the clock signal to generate an adjusted clock signal. The memory device may also include a second sampler configured to sample the command signal according to the adjusted clock signal to generate time-adjusted commands. The memory device may also include a timing-analysis module communicatively coupled to the first sampler, the adjustment element, and the second sampler. The timing-analysis module may be configured to compare the standard-timing commands and the time-adjusted commands. The timing-analysis module may also be configured to determine an improved timing for the clock signal based on the comparison of the standard-timing commands and the time-adjusted commands.

Various embodiments may include a system. The system may include at least one input device, at least one output device, at least one processor device operably coupled to the input device and the output device, and at least one memory device operably coupled to the at least one processor device. The at least one memory device may include a first sampler configured to sample a command signal according to a clock signal to generate standard-timing commands. The at least one memory device may also include an adjustment element configured to advance or delay the clock signal to generate an adjusted clock signal. The at least one memory device may also include a second sampler configured to sample the command signal according to the adjusted clock signal to generate time-adjusted commands. The at least one memory device may also include a timing-analysis module communicatively coupled to the first sampler, the adjustment element, and the second sampler. The timing-analysis module may be configured to compare the standard-timing commands and the time-adjusted commands. The timing-analysis module may also be configured to determine an improved timing for the clock signal based on the comparison of the standard-timing commands and the time-adjusted commands.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method comprising:
   sampling a command signal at a first clock edge of a clock signal to obtain a first standard-timing command;
   sampling the command signal at a second clock edge of the clock signal to obtain a second standard-timing command;
   sampling the command signal at the first clock edge plus or minus a first time offset to obtain a first time-adjusted command;
   sampling the command signal at the second clock edge plus or minus a second time offset to obtain a second time-adjusted command;
   comparing the first standard-timing command and the first time-adjusted command;
   comparing the second standard-timing command and the second time-adjusted command; and
   determining an improved timing for the clock signal based on the comparison of the first standard-timing command and the first time-adjusted command and the comparison of the second standard-timing command and the second time-adjusted command.

2. The method of claim 1, further comprising selecting the second time offset according to a search algorithm.

3. The method of claim 1, further comprising selecting the second time offset based on a search algorithm and the comparison of the first standard-timing command and the first time-adjusted command.

4. The method of claim 3, wherein selecting the second time offset based on the search algorithm comprises selecting the second time offset based on one of: a linear search algorithm, a binary search algorithm, and a random search algorithm.

5. The method of claim 1, further comprising:
   sampling the command signal according to the clock signal to obtain additional standard-timing commands;
   sampling the command signal according to the adjusted clock signal to obtain additional time-adjusted commands;
   comparing the additional standard-timing commands and the additional time-adjusted commands; and
   determining, based on the comparison of the additional standard-timing commands and the additional time-adjusted commands, a pass range indicative of time offsets for which the time-adjusted commands match the standard-timing commands.

6. The method of claim 5, further comprising:
   storing first time offsets of the adjusted clock signal for which the additional time-adjusted commands match the additional standard-timing commands; and
   storing second time offsets of the adjusted clock signal for which the additional time-adjusted commands do not match the additional standard-timing commands,
   wherein determining the pass range is further based on the first time offsets and the second time offsets.

7. The method of claim 5, wherein determining the improved timing comprises determining the improved timing is based on the pass range.

8. The method of claim 5, wherein determining the improved timing comprises determining the improved timing to be at a center of the pass range.

9. The method of claim 1, further comprising adjusting the clock signal based on the improved timing.

10. The method of claim 1, further comprising in response to a standard-timing command of the standard-timing commands not matching a corresponding time-adjusted command of the time-adjusted commands, comparing one or more of the standard-timing command and the corresponding time-adjusted command to another command signal to determine which of the standard-timing command and the time-adjusted command corresponds with the other command signal.

11. A method for reducing timing errors in a memory device, the method comprising:
    obtaining a clock signal;
    obtaining a command signal;
    sampling the command signal at a first clock edge of the clock signal to obtain a first standard-timing command;
    sampling the command signal at a second clock edge of the clock signal to obtain a second standard-timing command;
    sampling the command signal at the first clock edge plus or minus a first time offset to obtain a first time-adjusted command;
    sampling the command signal at the second clock edge plus or minus a second time offset to obtain a second time-adjusted command;
    comparing the first standard-timing command and the first time-adjusted command;
    comparing the second standard-timing command and the second time-adjusted command;
    determining an improved timing for the clock signal based on the comparison of the first standard-timing command and the first time-adjusted command and the comparison of the second standard-timing command and the second time-adjusted command;
    performing operations at the memory device based on the command signal; and
    while the operations are ongoing, without interrupting the operations, adjusting the clock signal to align the clock signal with the command signal based on the improved timing.

12. The method of claim 11, wherein adjusting the clock signal further comprises repeatedly adjusting the clock signal.

13. A memory device comprising:
    a first sampler configured to sample a command signal according to a clock signal to generate standard-timing commands comprising a first standard-timing command corresponding to a first clock edge of the clock signal and a second standard-timing command corresponding to a second clock edge of the clock signal;
    an adjustment element configured to advance or delay the clock signal to generate an adjusted clock signal;
    a second sampler configured to sample the command signal according to the adjusted clock signal to generate time-adjusted commands comprising a first time-adjusted command corresponding to the first clock edge plus or minus a first time offset and a second time-adjusted command corresponding to the second clock edge plus or minus a second time offset;
    a timing-analysis module communicatively coupled to the first sampler, the adjustment element, and the second sampler, the timing-analysis module configured to:
        compare the standard-timing commands, including the first standard-timing command and the second standard-timing command, and the time-adjusted commands, including the first time-adjusted command and the second time-adjusted command; and
        determine an improved timing for the clock signal based on the comparison of the standard-timing commands, including the first standard-timing command and the second standard-timing command, and the time-adjusted commands, including the first time-adjusted command and the second time-adjusted command.

14. The memory device of claim 13, wherein the timing-analysis module is further configured to determine time offsets, including the second time offset, for the adjusted clock signal based on a search algorithm and the comparison of the standard-timing commands and the time-adjusted commands and wherein the adjustment element is configured to generate the adjusted clock signal based on the time offsets.

15. The memory device of claim 13, further comprising an improvement adjustment element configured to advance or delay the clock signal based on the improved timing.

16. The memory device of claim 13, wherein the timing-analysis module is further configured to, in response to a standard-timing command of the standard-timing commands not matching a corresponding time-adjusted command of the time-adjusted commands, compare one or more of the standard-timing command and the corresponding time-adjusted command to another command signal to determine which of the standard-timing command and the time-adjusted command is correct.

17. A system, comprising:
    at least one input device;
    at least one output device;
    at least one processor device operably coupled to the input device and the output device; and
    at least one memory device operably coupled to the at least one processor device, the at least one memory device comprising:
        a first sampler configured to sample a command signal according to a clock signal to generate standard-timing commands comprising a first standard-timing command corresponding to a first time and a second standard-timing command corresponding to a second time;
        an adjustment element configured to advance or delay the clock signal to generate an adjusted clock signal;
        a second sampler configured to sample the command signal according to the adjusted clock signal to generate time-adjusted commands comprising a first time-adjusted command corresponding to the first time plus or minus a first time offset and a second time-adjusted command corresponding to the second time plus or minus a second time offset;
        a timing-analysis module communicatively coupled to the first sampler, the adjustment element, and the second sampler, the timing-analysis module configured to:
            compare the standard-timing commands, including the first standard-timing command and the second standard-timing command, and the time-adjusted commands, including the first time-adjusted command and the second time-adjusted command; and
            determine an improved timing for the clock signal based on the comparison of the standard-timing commands, including the first standard-timing command and the second standard-timing command, and the time-adjusted commands, including the first time-adjusted command and the second time-adjusted command.

* * * * *